United States Patent
Wu et al.

(10) Patent No.: US 8,154,080 B2
(45) Date of Patent: Apr. 10, 2012

(54) DIELECTRIC STRUCTURE HAVING LOWER-K AND HIGHER-K MATERIALS

(75) Inventors: Yiliang Wu, Oakville (CA); Paul F Smith, Oakville (CA)

(73) Assignee: Xerox Corporation, Norwalk, CT (US)

( * ) Notice: Subject to any disclaimer, the term of this patent is extended or adjusted under 35 U.S.C. 154(b) by 390 days.

(21) Appl. No.: 12/328,849

(22) Filed: Dec. 5, 2008

(65) Prior Publication Data

US 2010/0140705 A1    Jun. 10, 2010

(51) Int. Cl.
*H01L 29/06* (2006.01)
(52) U.S. Cl. .......................... 257/347; 257/40
(58) Field of Classification Search ............ 257/40, 257/59, 66, 72, 347
See application file for complete search history.

(56) References Cited

U.S. PATENT DOCUMENTS

| | | | |
|---|---|---|---|
| 5,883,219 A | | 3/1999 | Carter et al. |
| 6,465,532 B1 * | | 10/2002 | Hekal ............... 521/64 |
| 6,528,409 B1 | | 3/2003 | Lopatin et al. |
| 6,706,464 B2 | | 3/2004 | Foster et al. |
| 6,809,371 B2 | | 10/2004 | Sugiyama |
| 7,098,525 B2 | | 8/2006 | Bai et al. |
| 2001/0008434 A1 * | 7/2001 | Battersby et al. ............. 349/38 |
| 2006/0214154 A1 * | 9/2006 | Yang et al. ................ 257/40 |
| 2008/0012006 A1 * | 1/2008 | Bailey et al. ............... 257/40 |
| 2010/0006826 A1 * | 1/2010 | Dimmler .................... 257/40 |
| 2010/0067172 A1 * | 3/2010 | Zhang et al. ............. 361/323 |
| 2010/0270542 A1 * | 10/2010 | Zhu ........................ 257/40 |

OTHER PUBLICATIONS

Yiliang Wu et al., U.S. Appl. No. 11/695,131, filed Apr. 2, 2007, titled Phase-Separated Dielectric Structure Fabrication Process.
Yiliang Wu et al., U.S. Appl. No. 11/695,138, filed Apr. 2, 2007, titled Device With Phase-Separated Dielectric Structure.
Yiliang Wu et al., U.S. Appl. No. 11/276,634, filed Mar. 8, 2006, titled TFT Fabrication Process.
Yiliang Wu et al., U.S. Appl. No. 11/104,728, filed Apr. 13, 2005, titled Multilayer Gate Dielectric.
Antonio Facchetti et al., "Gate Dielectrics for Organic Field-Effect Transistors: New Opportunities for Organic Electronics," Adv. Mater., vol. 17, pp. 1705-1725 (2005).

* cited by examiner

*Primary Examiner* — Marcos D. Pizarro
*Assistant Examiner* — Suian Tang
(74) *Attorney, Agent, or Firm* — Zosan S. Soong; Fay Sharpe LLP

(57) ABSTRACT

An electronic device including in any sequence: (a) a semiconductor layer; and (b) a dielectric structure comprising a lower-k dielectric polymer and a higher-k dielectric polymer, wherein the lower-k dielectric polymer is in a lower concentration than the higher-k dielectric polymer in a region of the dielectric structure closest to the semiconductor layer.

19 Claims, 2 Drawing Sheets

US 8,154,080 B2

DIELECTRIC STRUCTURE HAVING LOWER-K AND HIGHER-K MATERIALS

CROSS-REFERENCE TO RELATED APPLICATIONS

Yiliang Wu et al., U.S. application Ser. No. 11/695,131, filed Apr. 2, 2007, titled PHASE-SEPARATED DIELECTRIC STRUCTURE FABRICATION PROCESS.

Yiliang Wu et al., U.S. application Ser. No. 11/695,138, filed Apr. 2, 2007, titled DEVICE WITH PHASE-SEPARATED DIELECTRIC STRUCTURE.

Yiliang Wu et al., U.S. application Ser. No. 11/276,634, filed Mar. 8, 2006, titled TFT FABRICATION PROCESS.

Yiliang Wu et al., U.S. application Ser. No. 11/104,728, filed Apr. 13, 2005, titled MULTILAYER GATE DIELECTRIC.

BACKGROUND OF THE INVENTION

The present disclosure relates, in various representative embodiments, to electronic devices and materials suitable for use in such devices as well as fabrication processes for electronic devices and components thereof. More specifically, the present disclosure relates to electronic devices incorporating a dielectric structure as well as fabrication processes for such electronic devices and dielectric structures. Further more specifically, the present disclosure relates in embodiments to electronic devices including a phase-separated dielectric structure as well as fabrication processes for such electronic devices and phase-separated dielectric structures.

Thin film transistors (TFT) are fundamental components in modern-age electronics, including, for example, sensor, imaging, and display devices. Thin film transistor circuits using current mainstream silicon technology may be too costly, particularly for large-area devices (e.g., backplane switching circuits for displays like active matrix liquid crystal monitors or televisions) and low-end applications (e.g. Radio Frequency Identification (RFID) Tags), where high switching speeds are not essential. The high costs of silicon-based thin film transistor circuits are primarily due to the capital-intensive fabrication facilities and the complex high-temperature, high-vacuum photolithographic fabrication processes under strictly controlled environments.

Because of the cost and complexity of fabricating silicon-based thin film transistor circuits using conventional photolithography processes, there has been an increased interest in plastic/organic thin film transistors which can potentially be fabricated using liquid-based patterning and deposition techniques, such as spin coating, solution casting, dip coating, stencil/screen printing, flexography, gravure, offset printing, ink jet-printing, micro-contact printing, and the like, or a combination of these processes. Such processes are generally simpler and more cost effective compared to the complex photolithographic processes used in fabricating silicon-based thin film transistor circuits for electronic devices. To fabricate liquid-processed thin film transistor circuits, liquid processable materials are therefore required.

Most of the current materials research and development activities for plastic thin film transistors have been devoted to semiconductor materials, particularly liquid-processable organic and polymer semiconductors. On the other hand, other material components such as dielectric materials have not been receiving much attention.

In embodiments, it is desirable for the materials for the dielectric to have a number of attributes including for example the following: (1) a good electrical insulating property; and (2) a good compatibility with the semiconductor materials. An issue with conventional gate dielectrics is that it may be difficult to accommodate all the desired attributes for the dielectric materials via a simple process. Accommodating the desired attributes (1) and (2) is accomplished by embodiments of the present invention.

The following documents provide background information:

Lopatin et al., U.S. Pat. No. 6,528,409.
Foster et al., U.S. Pat. No. 6,706,464.
Carter et al., U.S. Pat. No. 5,883,219.
Bai et al., U.S. Pat. No. 7,098,525 B2.
Sugiyama, U.S. Pat. No. 6,809,371 B2.
Antonio Facchetti et al., "Gate Dielectrics for Organic Field-Effect Transistors: New Opportunities for Organic Electronics," Adv. Mater., Vol. 17, pp. 1705-1725 (2005).

SUMMARY OF THE DISCLOSURE

There is provided in embodiments an electronic device comprising in any sequence:
 (a) a semiconductor layer; and
 (b) a dielectric structure comprising a lower-k dielectric polymer and a higher-k dielectric polymer, wherein the lower-k dielectric polymer is in a lower concentration than the higher-k dielectric polymer in a region of the dielectric structure closest to the semiconductor layer.

In further embodiments, there is provided an electronic device comprising in any sequence:
 (a) an organic semiconductor layer; and
 (b) a dielectric structure comprising a lower-k dielectric polymer and a higher-k dielectric polymer, wherein the lower-k dielectric polymer is at a concentration ranging from about 40% to 0% and the higher-k dielectric polymer is at a concentration ranging from about 60% to 100% of the total weight of the lower-k and the higher-k dielectric polymers in a region of the dielectric structure closest to the semiconductor layer.

In additional embodiments, there is provided a thin film transistor comprising in any sequence:
 (a) a semiconductor layer; and
 (b) a gate dielectric comprising a lower-k dielectric polymer-majority/higher-k dielectric polymer-minority first phase and a higher-k dielectric polymer-majority/lower-k dielectric polymer-minority second phase, wherein the lower-k dielectric polymer is in a lower concentration than the higher-k dielectric polymer in a region of the dielectric structure closest to the semiconductor layer.

BRIEF DESCRIPTION OF THE DRAWINGS

Other aspects of the present invention will become apparent as the following description proceeds and upon reference to the following figures which represent illustrative embodiments.

Unless otherwise noted, the same reference numeral in different Figures refers to the same or similar feature.

DETAILED DESCRIPTION

Figure 1:
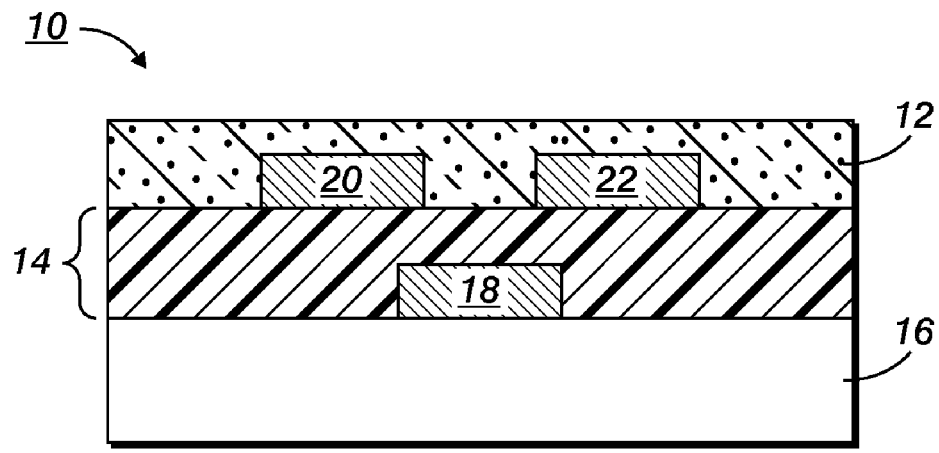
FIG. 1 represents a first embodiment of the present invention in the form of a TFT.

Aspects of the present disclosure relate to an electronic device (e.g., a thin film transistor) comprising a dielectric structure which may be phase-separated in embodiments. In the context of a thin film transistor, the dielectric structure also can be referred to as a "gate dielectric." The dielectric structure can be used in any suitable electronic device. Besides a thin film transistor, other types of suitable electronic devices include for example an embedded capacitor and an electroluminescent lamp.

In fabricating the present dielectric structure, a dielectric composition is prepared comprising a lower-k dielectric material, a higher-k dielectric material, and a liquid, wherein the lower-k dielectric material and the higher-k dielectric material are not phase separated prior to the liquid depositing.

In embodiments, the terms "lower-k dielectric material" and "higher-k dielectric material" are used to differentiate two types of dielectric materials (based on the dielectric constant) in the dielectric composition and in the dielectric structure. Therefore, any suitable dielectric material can be the lower-k dielectric material, and any suitable dielectric material which has a higher dielectric constant than the lower-k dielectric material can be the higher-k dielectric material. The "lower-k dielectric material" can comprise one, two, or more suitable materials. The "higher-k dielectric material" can comprise one, two, or more suitable materials.

In embodiments, the lower-k dielectric material is an electrically insulating material which is compatible or has good compatibility with a semiconductor layer in the device. The term "compatible" (or "compatibility") refers to how well the semiconductor layer can perform electrically when it is adjacent to a surface rich in the lower-k dielectric material. For example, a hydrophobic surface is generally preferred for polythiophene semiconductors. In embodiments, the lower-k dielectric material has a hydrophobic surface and therefore may exhibit satisfactory to excellent compatibility with polythiophene semiconductors.

In embodiments, the lower-k dielectric material has a dielectric constant (permittivity) of for instance less than 4.0, or less than about 3.5, or particularly less than about 3.0. In embodiments, the lower-k dielectric material has non-polar or weak polar groups such as methyl group, phenylene group, ethylene group, Si—C, Si—O—Si, and the like. In embodiments, the lower-k dielectric material is a lower-k dielectric polymer. Representative lower-k dielectric polymer includes but is not limited to polystyrene, poly(4-methylstyrene), poly (chlorostyrene), poly($\alpha$-methylstyrene), polysiloxane such as poly(dimethyl siloxane) and poly(diphenyl siloxane), polysilsesquioxane such as poly(ethylsilsesquioxane), poly(methyl silsisquioxane), and poly(phenyl silsesquioxane), polyphenylene, poly(1,3-butadiene), poly($\alpha$-vinylnaphtalene), polypropylene, polyisoprene, polyisobutylene, polyethylene, poly(4-methyl-1-pentene), poly(p-xylene), poly(cyclohexyl methacrylate), poly(propylmethacrylPOSS-co-methylmethacrylate), poly(propylmethacrylPOSS-co-styrene), poly(styrylPOSS-co-styrene), poly(vinyl cinnamate), and the like, and mixtures thereof The term "POSS" refers to Polyhedral Oligomeric Silsesquioxanes. In embodiments, the lower-k dielectric material comprises a polysilsesquioxane, particularly poly(methyl silsisquioxane). The dielectric constant is of the materials at room temperature measured at 1 kHz frequency.

In embodiments, the surface of lower-k dielectric material, when cast as a film, has a low surface energy. To characterize the surface energy, advancing water contact angle can be used. A high contact angle indicates a low surface energy. In embodiments, the contact angle is 80 degrees or higher, or higher than about 90 degrees, or particularly higher than about 95 degrees.

In embodiments, the higher-k dielectric material is an electrically insulating material containing for instance polar groups such as hydroxyl group, amino group, cyano group, nitro group, C=O group, and the like. In embodiments, the higher-k dielectric material has a dielectric constant of 4.0 or more, or more than about 5.0, or particularly more than about 6.0. In embodiments, the higher-k dielectric material is a higher-k dielectric polymer. Any suitable higher-k dielectric polymer such as polyimide, polyester, polyether, polyacrylate, polyvinyl, polyketone, and polysulfone can be used. Representative higher-k dielectric polymer includes but is not limited to poly(4-vinyl phenol) (PVP), poly(vinyl alcohol), and poly(2-hydroxylethyl methacrylate) (PHEMA), cyanoethylated poly(vinyl alcohol), cyanoethylated cellulose, poly (vinylidene fluoride) (PVDF), poly(vinyl pyridine), copolymer thereof, and the like. In embodiments, the higher-k dielectric material is PVP and/or PHEMA.

In embodiments, the higher-k dielectric material, when cast as a film, has a high surface energy. In terms of advancing water contact angle, the angle is for instance lower than 80 degrees, or lower than about 60 degrees, or lower than about 50 degrees.

In embodiments, the difference in magnitude of the dielectric constant of the higher-k dielectric material versus the lower-k dielectric material is at least about 0.5, or at least about 1.0, or at least about 2.0, for example from about 0.5 to about 200.

In embodiments, the present dielectric structure which may be phase-separated contains intentionally created pores (also referred to as voids and apertures) such as those created using processes and materials similar to those described in for example Lopatin et al., U.S. Pat. No. 6,528,409; Foster et al., U.S. Pat. No. 6,706,464; and Carter et al., U.S. Pat. No. 5,883,219. In other embodiments, the present dielectric structure does not contain such intentionally created pores (but pinholes may be present in certain embodiments which are not intentionally created but rather are an undesired byproduct of the present process). The pinhole density in embodiments is for example less than 50 per $mm^2$ (square millimeter), or less than 10 per $mm^2$, or less than 5 $mm^2$. In further embodiments, the present dielectric structure is pinhole free. In embodiments, the dielectric composition is non-photoimageable. In embodiments, there is absent a step to create pores in the dielectric structure.

In embodiments, the dielectric structure has an overall dielectric constant of more than about 4.0, or more than about 5.0, particularly more than about 6.0. The overall dielectric constant can be characterized with a metal/dielectric structure/metal capacitor. Particularly for thin film transistor application, a high overall dielectric constant is desirable in embodiments, so that the device can be operated at a relatively low voltage.

One, two or more suitable fluids can be used for the liquid (which facilitates the liquid depositing). In embodiments, the liquid is capable of dissolving the lower-k dielectric material and the higher-k dielectric material. Representative liquid includes but is not limited to water, alcohol such as methanol, ethanol, propanol, butanol, and methoxyethanol, acetate such as ethyl acetate and propylene glycol monoethyl ether aceate, ketone such as methyl isobutyl ketone, methyl isoamyl ketone, acetone, methyl ethyl ketone, and methyl propyl ketone, ether such as petroleum ether, tetrahydrofuran, and methyl t-butyl ether, hydrocarbon such as hexane, cyclohexane, cyclopentane, hexadecane, iso-octane, aromatic hydrocarbon such as toluene, xylene, ethyl benzene, and mesitylene, chlorinated solvent such as chloroform, dichloromethane, dichloroethane, chlorobenzene, dichlorobenzene, and trichlorobenzene, and other solvent such as dimethyl sulfoxide, trifluoroacetic acid, acetonitrile, dimethyl formamide, dimethyl acetamide, pyridine, n-methyl-alpha-pyrrolidinone.

Other materials can be added into the dielectric composition. Representative materials include a crosslinking agent for the lower-k dielectric material and/or for the higher-k dielectric material such as for example poly(melamine-co-formaldehyde. A catalyst for crosslinking may also be included such as for example toluenesulfonic acid. Inorganic nanoparticles used to boost the dielectric constant may be included such as for example $Al_2O_3$, $TiO_2$.

The concentration of each of the above listed components in the dielectric composition varies from about 0.001 to about 99 percent by weight. The concentration of the lower-k dielectric material is for example from about 0.1 to about 30 percent by weight, or from about 1 to about 20 percent by weight. The concentration of the higher-k dielectric material is for example from about 0.1 to about 50 percent by weight, or from about 5 to about 30 percent by weight. The concentration of crosslinking agent and catalyst for crosslinking reaction will depend on the concentration of the dielectric materials. The ratio of the crosslinking agent to the dielectric materials is for example from about 1:99 to about 50:50, or from about 5:95 to about 30:70 by weight. The ratio of the catalyst to the dielectric materials is for example from about 1:9999 to about 5:95, or from 1:999 to about 1:99 by weight. The inorganic nanoparticle can be for example from about 0.5 to about 30 percent by weight, or from about 1 to about 10 percent by weight.

In embodiments, the lower-k dielectric material and the higher-k dielectric material are not phase separated in the dielectric composition. In embodiments, the phrase "not phase separated" means for example that the lower-k dielectric material and the higher-k dielectric material are dissolved in the liquid. In embodiments, "dissolved" indicates total dissolution or partial dissolution of the lower-k dielectric material and the higher-k dielectric material in the liquid. In embodiments, the phrase "not phase separated" means for example that the lower-k dielectric material, the higher-k dielectric material and the liquid are miscible to form a single phase over certain ranges of temperature, pressure, and composition. The temperature range is for example from 0 to 150 degrees C., particularly at about room temperature. The pressure is for example about 1 atmosphere. In the dielectric composition prior to the liquid depositing, the lower-k dielectric material and the higher-k dielectric material can be present for example from about 0.1 to about 90 weight percent, or from about 0.5 to about 50 weight percent, based on the total weight of the lower-k dielectric material, the higher-k dielectric material and the liquid. The ratio between the higher-k dielectric material to the lower-k dielectric material can be for example from about 1:99 to 99:1, or from about 5:95 to about 95:5, particularly from about 10:90 to about 40:60 (first recited value in each ratio represents the lower-k dielectric material).

In embodiments where the lower-k dielectric material, the higher-k dielectric material and the liquid are miscible to form a single phase (typically a clear solution) prior to the liquid depositing, the single phase can be confirmed by light scattering technique, or visually detected by human eyes without the assistance of any tools.

Prior to the liquid depositing, the dielectric composition may contain in embodiments aggregates of the lower-k dielectric material and/or higher-k dielectric material. These aggregates may be for example on a scale less than the wavelength of visible light, or less than 100 nm, particularly less than 50 nm. For purposes of the present invention, these aggregates, if present in the dielectric composition, are not considered the result of phase separation or phase-separated; moreover, these aggregates are not considered the "first phase" and/or the "second phase."

The dielectric composition is liquid deposited onto a substrate. Any suitable liquid depositing technique may be employed. In embodiments, the liquid depositing includes blanket coating such as spin coating, blade coating, rod coating, dip coating, and the like, and printing such as screen printing, ink jet printing, stamping, stencil printing, screen printing, gravure printing, flexography printing, and the like.

In embodiments, the liquid depositing can be accomplished in a single step. The term "single step" refers to liquid depositing both the first and the second dielectric materials at the same time from one dielectric composition. This is different from the process for fabricating conventional dual-layer dielectric structure, wherein two different dielectric materials are liquid deposited separately from two different dielectric compositions. "Step" in "single step" is different from the term "pass". In embodiments, in order to increase thickness of the dielectric structure, more than 1 pass can be carried out during the single step deposition of the dielectric composition.

In fabricating the dielectric structure, the present process involves in embodiments causing phase separation of the lower-k dielectric material and the higher-k dielectric material to form a dielectric structure comprising in embodiments a lower-k dielectric material-majority/higher-k dielectric material-minority first phase and a higher-k dielectric material-majority/lower-k dielectric material-minority second phase. The term "causing" includes spontaneous occurrence of phase separation during liquid deposition when the liquid evaporates. The term "causing" also includes external assistance for facilitating the phase separation during and after the liquid deposition; in embodiments, phase separation is caused by for example thermal annealing and/or solvent annealing. Thermal annealing could be performed at any suitable temperature, for example at a temperature higher than the glass transition temperature or melting point of one of the dielectric material. The thermal annealing time, depending on particular dielectric combination, could be for example from about 1 min to about 1 day, or from about 1 min to 1 hour. Solvent annealing can be done at any temperature such as room temperature or an elevated temperature by exposing the deposited dielectric structure to vapor of one or more solvents. Representative solvents can be selected for instance from the liquids described herein for the liquid depositing. The solvent annealing time, depending on particular dielectric combination, could be for example from about a few seconds to about 1 week, or from about 1 min to 2 hours.

In embodiments, the term "phase" in "first phase" and "second phase" means a domain or domains of material in which a property such as chemical composition is relatively uniform. Accordingly, the term "interphase" refers to an area between the first phase and the second phase in the phase-separated dielectric structure in which a gradient in composition exists. In embodiments, the dielectric structure comprises the sequence: the first phase, optional interphase, and the second phase.

In embodiments, the "phase-separated" nature of the present phase-separated dielectric structure is manifested by any of the following possible representative morphologies of the first phase and the second phase: (1) an interphase (in the form of a layer) present between the first phase (in the form of a layer) and the second phase (in the form of a layer); (2) one phase forms a plurality of "dots" in a continuous matrix of the other phase; (3) one phase forms a plurality of rod-shaped elements (e.g. cylinders) in a continuous matrix of the other phase; and (4) one phase is interpenetrating into the other phase to form bicontinuous domains. In embodiments, morphology (2), (3), or (4) may be present, but not (1).

The "phase-separated" nature regarding the morphology of the first phase and the second phase can be determined by various analyses such as for example the following: Scanning Electron Microscopy (SEM) and Atomic Force Microscopy (AFM) analysis of surface and cross-section of the dielectric structure; and Transmission Electron Microscopy (TEM) analysis of a cross-section of the dielectric structure. Other tools such as light scattering and X-ray (wide angle and small angle X-rays) scattering could also be used.

In embodiments, morphology (1) involving the interphase differs from a conventional dual-layer gate dielectric having an interfacial layer in that the interphase involves a gradient composition change; whereas the interfacial layer involves a discontinuous composition change, not a gradient composition change. In embodiments, another difference is that the present interphase is relatively thick, involving a thickness ranging from about 10 nm to about 50 nm, which typically is significantly larger than any interfacial layer found in a conventional dual-layer gate dielectric which may have a interfacial layer thickness of less than about 5 nm, particularly less than about 3 nm.

In embodiments, the first phase comprises the lower-k dielectric material in the majority and the higher-k dielectric material in the minority. The second phase comprises the lower-k dielectric material in the minority and the higher-k dielectric material in the majority. The term "majority" means more than 50% by weight of the total weight of the lower-k dielectric material and the higher-k dielectric material in a phase of the phase-separated dielectric structure. In embodiments, the term "majority" indicates 51 to 100% by weight, about 55 to about 95% by weight, or about 80 to 100% by weight in a phase of the dielectric structure.

The term "minority" means less than 50% by weight of the total weight of the lower-k dielectric material and the higher-k dielectric material in a phase of the dielectric structure. In embodiments, the term "minority" indicates 49 to 0% by weight, about 45 to about 5% by weight, or about 20 to 0% by weight in a phase of the dielectric structure.

In embodiments, the lower-k dielectric material is in a lower concentration than the higher-k dielectric material in a region of the dielectric structure closest to the layer comprising the semiconductor.

The term "region" refers to a thin slice (parallel to the surface of the dielectric structure) of the dielectric structure closest to the semiconductor layer. The region is examined to determine its concentration of the lower-k dielectric material and the higher-k dielectric material. In embodiments, the region contains a portion of or all of the first phase and optionally a portion of or all of the second phase. In embodiments, the optional interfacial layer may be present in the dielectric structure and thus the region may include the interfacial layer as long as the region has a sufficient thickness to include a portion or all of the first phase and optionally a portion or all of the second phase. The region has any suitable thickness for use in an analytical technique such as for example from about 1 nm to about 100 nm, or from about 5 nm to about 100 nm, or particularly from about 5 nm to about 50 nm. Various methods can be used to determine the concentration of the first dielectric material and the second dielectric material. For example, X-Ray Photoelectron Spectroscopy (XPS) can be used to analyze the concentration of each atom of different dielectric materials in the region. AFM could be used to determine domain size of different phases. TEM on cross-section of the region could also be used to determine domain size of difference phases and concentration of each atom of different dielectric materials. In certain embodiments, the combination of different methods may be used. In case of significant variation in results from different methods, the results from TEM analysis is preferred.

In embodiments of the "region," the higher-k dielectric material is at a concentration for example ranging from about 60% to 100%, from about 60% to about 90%, or from about 80% to 100%, and the lower-k dielectric material is at a concentration ranging from about 40% to 0%, from about 40% to about 10%, or from about 20% to 0%. The concentration can be controlled by various factors such as the initial ratio of the lower-k dielectric material and the higher-k dielectric material in the dielectric composition, the concentration of the dielectric materials in the dielectric composition, the miscibility of the dielectric materials, the processing conditions such as the annealing time and annealing temperature.

In order to achieve phase separation, in embodiments, the lower-k dielectric material and higher-k dielectric material are intentionally chosen to be immiscible or partial miscible in solid state. The miscibility (capability of a mixture to form a single phase) of two dielectric materials such as two polymers can be predicted by looking at their interaction parameter, $\chi$. Generally speaking, a polymer is miscible with another polymer which is similar to it.

In embodiments where the dielectric structure is layered (morphology (1)), the first phase has a thickness for example from about 1 nm to about 500 nm, or from about 5 nm to about 200 nm, or from about 5 nm to about 50 nm. The second phase has a thickness for example from about 5 nm to about 2 micrometer, or from about 10 nm to about 500 nm, or from about 100 nm to about 500 nm. The dielectric structure has an overall thickness for example from about 10 nm to about 2 micrometers, or from about 200 nm to about 1 micrometer, or from about 300 to about 800 nm.

In embodiments, the lower-k dielectric material in the dielectric structure is crosslinked. In embodiments, the lower-k dielectric material in the dielectric structure is self-crosslinked. In embodiments, the lower-k dielectric material in the dielectric structure is thermally self-crosslinked. In embodiments, both the lower-k dielectric material and the higher-k dielectric material in the dielectric structure are crosslinked.

In embodiments, the dielectric structure which may be phase-separated in embodiments comprises a polymer blend where for example the lower-k dielectric material is a polymer and the higher-k dielectric material is a different polymer. In embodiments, the phase-separated polymer blend is a binary blend. In other embodiments, the phase-separated polymer blend is a ternary blend or a quaternary blend when a third or a fourth dielectric material is added respectively. As used herein, the term "blend" merely indicates the presence of two or more materials and does not imply the concentration or distribution of the lower-k dielectric material and the high-k dielectric material in the first phase and the second phase. Further aspects of the present disclosure relate to a thin film transistor comprising a phase-separated, polymer blend gate dielectric.

Optional interfacial layer could be present between the semiconductor layer and the dielectric structure. The interfacial layer may be prepared using the materials and procedures disclosed in for example Yiliang Wu et al., U.S. application Ser. No. 11/276,694, filed Mar. 10, 2006, the disclosure of which is totally incorporated herein by reference.

The present invention has several advantages. First, the process in embodiments can avoid multiple-step deposition of different dielectric materials by using the optional single step feature. Second, in embodiments, the phase-separated polymer blend dielectric may offer better properties via the combination of advantages of different polymers. The dielectric structure can be formed with any suitable method. In some embodiments, the dielectric structure is formed using phase-separation process discussed above. The dielectric structure is fabricated by single step deposition of the dielectric composition, and the lower-k and the higher-k dielectric materials phase-separated into different phases. In other embodiments, the dielectric structure is formed by multi-step deposition of the dielectric materials. For example, a lower-k dielectric material is deposited, followed by depositing the higher-k dielectric on top of the low-k dielectric material.

In embodiments, the dielectric structure is phase-separated dielectric structure. In embodiments, the transistor is a top-gate transistor, wherein the dielectric is formed by single step deposition of the dielectric composition. The dielectric structure comprises a lower-k dielectric polymer and a higher-k dielectric polymer, wherein the lower-k dielectric polymer is in a lower concentration than the higher-k dielectric polymer in a region of the dielectric structure closest to the semiconductor layer of the top-gate transistor.

In FIG. 1, there is schematically illustrated an organic thin film transistor ("OTFT") configuration 10 comprised of a substrate 16, in contact therewith a metal contact 18 (gate electrode) and a gate dielectric 14 on top of which two metal contacts, source electrode 20 and drain electrode 22, are deposited. Over and between the metal contacts 20 and 22 is an organic semiconductor layer 12 as illustrated herein.

Figure 2:
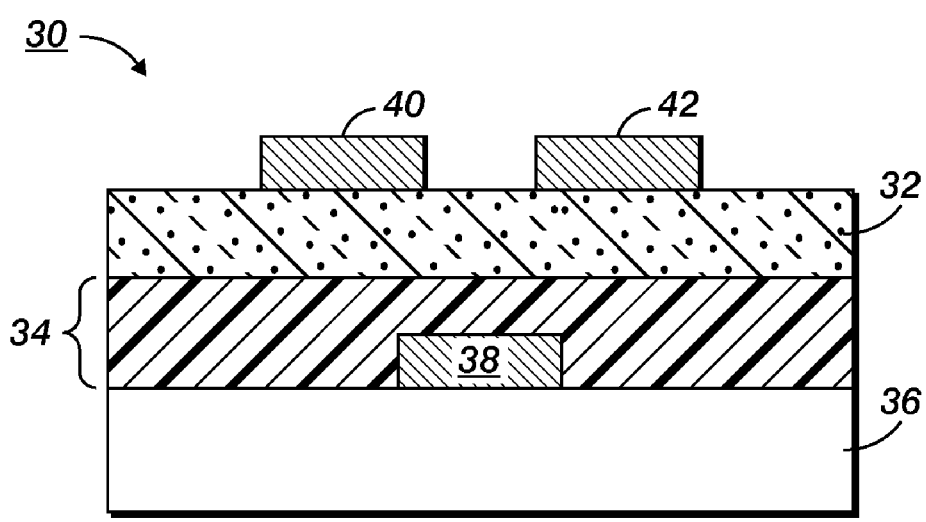
FIG. 2 represents a second embodiment of the present invention in the form of a TFT.

FIG. 2 schematically illustrates another OTFT configuration 30 comprised of a substrate 36, a gate electrode 38, a source electrode 40 and a drain electrode 42, a gate dielectric 34, and an organic semiconductor layer 32.

Figure 3:
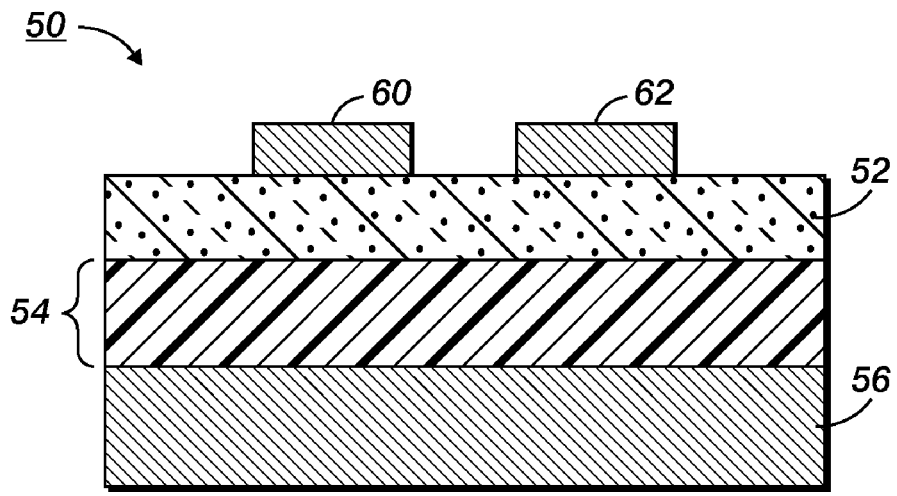
FIG. 3 represents a third embodiment of the present invention in the form of a TFT.

FIG. 3 schematically illustrates a further OTFT configuration 50 comprised of a heavily n-doped silicon wafer 56 which acts as both a substrate and a gate electrode, a gate dielectric 54, and an organic semiconductor layer 52, on top of which are deposited a source electrode 60 and a drain electrode 62.

Figure 4:
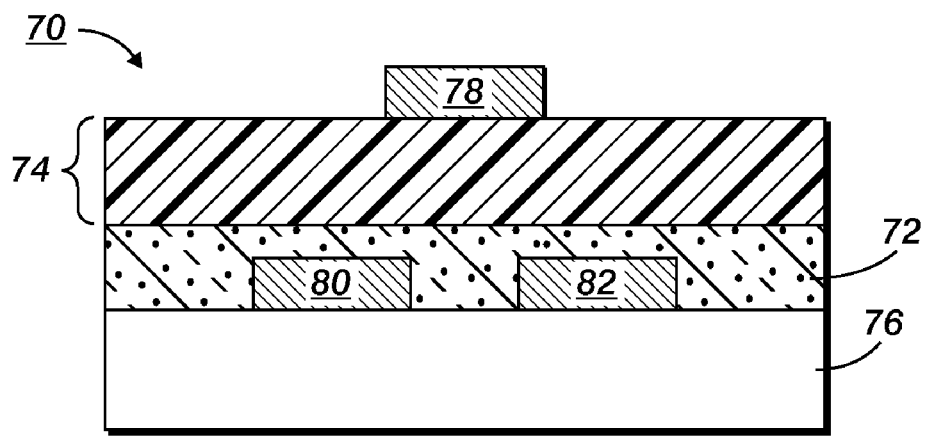
FIG. 4 represents a fourth embodiment of the present invention in the form of a TFT.

FIG. 4 schematically illustrates an additional OTFT configuration 70 comprised of substrate 76, a gate electrode 78, a source electrode 80, a drain electrode 82, an organic semiconductor layer 72, and a gate dielectric 74.

Substrate

The substrate may be composed of for instance silicon, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors.

The source and drain electrode layers can be fabricated from materials which provide a low resistance ohmic contact to the semiconductor layer. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor Layer

Materials suitable for use as the organic semiconductor layer include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. application Ser. No. 10/042,342, which is published as U.S. Patent Application No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, microcontact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The composition and formation of the gate dielectric are described herein. In embodiments, the first phase and the second phase of the gate dielectric contact each other; in other embodiments, an interphase is present between the first phase and the second phase. In embodiments, the first phase of the gate dielectric contacts the semiconductor layer; in other embodiments, an interfacial layer is present between the first phase and the semiconductor layer. In embodiments, both the first phase and the second phase of the gate dielectric contact the semiconductor layer. In other embodiments, both the first phase and the second phase of the gate dielectric contact the semiconductor layer, wherein the contact area between the semiconductor layer and the first phase is larger than that between the semiconductor layer and the second phase in channel region (the region between the source and drain electrodes) of the thin film transistor.

The gate dielectric, the gate electrode, the semiconductor layer, the source electrode, and the drain electrode are formed in any sequence. In embodiments, the gate electrode and the semiconductor layer are both in contact with the gate dielectric, and the source electrode and the drain electrode are both in contact with the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

The invention will now be described in detail with respect to specific exemplary embodiments thereof, it being understood that these examples are intended to be illustrative only and the invention is not intended to be limited to the materials, conditions, or process parameters recited herein. All percentages and parts are by weight unless otherwise indicated. As used herein, room temperature refers to a temperature ranging for example from about 20 to about 25 degrees C.

COMPARATIVE EXAMPLE 1

In this Comparative Example, gate dielectric was prepared from poly(methyl silsesquioxane) (PMSSQ) which is a lower-k dielectric material. PMSSQ solution was prepared using methyltrimethoxysilane as precursor according to the following procedure. A mixture of 0.88 grams of aq. 0.1 wt % hydrochloric acid solution and 5.13 grams of tetrahydrofuran was added dropwise to a mixture of 4.08 grams of methyltrimethoxysilane and 9.24 grams of methylisobutylketone in a 3-necked flask cooled with an ice bath over a period of 30 minutes with rigorous stirring under a dry atmosphere. The resulting mixture was allowed to warm to room temperature and held there for 5 minutes before being heated to 60° C. and held there for 24 hours.

Top-gate transistors as illustrated by FIG. 4 were fabricated using the PMSSQ dielectric layer. On pre-cleaned glass substrate, source drain electrodes were deposited by vacuum evaporation through a shadow mask. A poly(3,3'''-didodecylquaterthiophene) (PQT-12) semiconductor layer (PQT-12 is disclosed in Beng S. Ong, et. al. J. Am. Chem. Soc. 2004, 126, 3378-3379, the disclosure of which is totally incorporated herein by reference) was deposited over the source drain electrodes by spin coating. After drying at 80° C. for 30 min, the semiconductor layer was annealed in vacuum oven at 140° C. for 10-15 min. The dielectric composition was first filtered with 0.2 micron syringe filter and then spin coated at 2000 rpm onto top of the semiconductor layer. After dried at 80° C. for 10 min, the dielectric layer was thermally crosslinked at 140° C. for 30 min in vacuum oven. OTFT devices were completed by vacuum evaporation of Al gate electrodes on top of the dielectric layer. The devices were characterized with Keithley 4200 SCS under ambient conditions. OTFTs with this dielectric structure showed very low device yield (<10%) due to the leakage of the dielectric layer. Functional device showed mobility 0.06 cm$^2$/V·s and a current on/off ratio 100-1000.

EXAMPLE 1

In this example, a dielectric composition comprising both lower-k and higher-k dielectric materials was used. PMSSQ was used as the lower-k dielectric materials, while poly(4-vinyl phenol) (PVP) was used as the higher-k dielectric materials. Poly(melamine-co-formaldehyde), was added as the crosslinking agent for the higher-k dielectric materials PVP. A dielectric composition was formulated using the amount of materials shown in the following table.

| Materials | amount |
|---|---|
| Liquid, n-butanol | 0.9 g |
| Higher-k dielectric material, PVP | 0.077 g |
| Lower-k dielectric material, PMSSQ (25 wt % solution) | 0.116 g |
| Crosslinking agent for higher-k dielectric material, poly(melamine-co-formaldehyde) (methylated, 84 wt % in n-butanol) | 0.08 g |

Top-gate transistors as described in Comparative Example 1 were fabricated using the dielectric composition. On pre-cleaned glass substrate, pairs of source drain electrodes were deposited by vacuum evaporation through a shadow mask. PQT-12 semiconductor was deposited subsequently by spin coating. After the previously deposited layers were dried and annealed, the dielectric composition was spin coated on top of the semiconductor layer after filtering with 0.2 micron syringe filter. The resulting dielectric layer was first dried at 80° C. for 10 min, followed by thermally annealing and crosslinking at 140° C. for 30 min in vacuum oven. OTFT devices were completed by vacuum evaporation of Al gate electrodes on top of the dielectric layer.

Characterization of the gate dielectric layer: Water contact angle measurement showed an advancing contact angle of 100°, which indicated very hydrophobic surface properties. The very hydrophobic characteristic revealed that the PMSSQ component migrated to the surface of the dielectric layer to form a phase-separated dielectric structure during spin coating and thermal crosslinking.

Phase separation was further confirmed by XPS measurement of the dielectric structure. Surface quantitative XPS analyses showed atom percentage as follows: Si, 27.8%; O, 38.7%; C, 33.4%. No strong evidence of aromatic carbon atom in PVP on the surface in a significant amount. High atom percentage of Si, which is only present in the lower-k dielectric material PMSSQ, is at the surface region (a few nanometers). The N atom which is only in the crosslinking agent for the higher-k dielectric material was absent from the surface. The depth profile XPS study of the phase-separated dielectric structure revealed that PMSSQ segregates to the topmost 40 nm of the surface. High concentration of O atom and Si atom, which are from the first dielectric material PMSSQ, was found in the topmost 40 nm region. The concentration of N atom started leveling off from the 40 nm away from the top surface. All above indicated a phase-separated structure with PMSSQ (lower-k dielectric material) majority phase at top of the dielectric structure and crosslinked PVP (higher-k dielectric material) majority phase at bottom of the dielectric structure which is closest to the semiconductor layer.

Characterization of OTFT devices. The devices were characterized with Keithley 4200 SCS under ambient conditions. OTFTs with this phase-separated dielectric structure with higher-k polymer majority phase closest to the semiconductor layer showed dramatically improved device yield (>90%). The devices showed average mobility of 0.1 cm$^2$/V·s and a current on/off ratio 10,000

From above Example and Comparative Example one can see that the device with the phase-separated lower-k dielectric material and the higher-k dielectric material blend showed both high mobility and high current on/off ratio.

It will be appreciated that various of the above-disclosed and other features and functions, or alternatives thereof, may be desirably combined into many other different systems or applications. Various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

The invention claimed is:

1. A top gate thin film transistor comprising:
    (a) a substrate;
    (b) a gate electrode;
    (c) a semiconductor layer; and
    (d) a dielectric structure comprising a lower-k dielectric polymer and a higher-k dielectric polymer;
    wherein the semiconductor layer contacts the substrate;
    wherein the dielectric structure is between the gate electrode and the semiconductor layer; and
    wherein the lower-k dielectric polymer is in a lower concentration than the higher-k dielectric polymer in a region of the dielectric structure closest to the semiconductor layer.

2. The thin film transistor of claim 1, wherein the lower-k dielectric polymer is at a concentration ranging from about 40% to 0% and the higher-k dielectric polymer is at a concentration ranging from about 60% to 100% of the total weight of the lower-k and the higher-k dielectric polymers in the region of the dielectric structure closest to the layer comprising the semiconductor.

3. The thin film transistor of claim 1, wherein the lower-k dielectric polymer is at a concentration ranging from about 40% to about 10% and the higher-k dielectric polymer is at a concentration ranging from about 60% to about 90% of the total weight of the lower-k and the higher-k dielectric polymers in the region of the dielectric structure closest to the layer comprising the semiconductor.

4. The thin film transistor of claim 1 wherein the lower-k dielectric polymer has a dielectric constant of less than 4.0.

5. The thin film transistor of claim 1, wherein the higher-k dielectric polymer has a dielectric constant of 4.0 or more.

6. The thin film transistor of claim 1, wherein the dielectric structure further comprises an interfacial layer.

7. The thin film transistor of claim 1, wherein the dielectric structure is a phase separated dielectric structure.

8. A top gate thin film transistor comprising:
    (a) a substrate;
    (b) a gate electrode;
    (c) an organic semiconductor layer; and
    (d) a dielectric structure comprising a lower-k dielectric polymer and a higher-k dielectric polymer,
    wherein the lower-k dielectric polymer is at a concentration ranging from about 40% to 0% and the higher-k dielectric polymer is at a concentration ranging from about 60% to 100% of the total weight of the lower-k and the higher-k dielectric polymers in a region of the dielectric structure closest to the semiconductor layer.

9. The electronic device of claim 8, wherein the lower-k dielectric polymer is at a concentration ranging from about 40% to about 10% and the higher-k dielectric polymer is at a concentration ranging from about 60% to about 90% of the total weight of the lower-k and the higher-k dielectric polymers in the region of the dielectric structure closest to the layer comprising the semiconductor.

10. The electronic device of claim 8, wherein the lower-k dielectric polymer has a dielectric constant of less than 4.0.

11. The electronic device of claim 8, wherein the higher-k dielectric polymer has a dielectric constant of 4.0 or more.

12. The electronic device of claim 8, wherein the dielectric structure is a phase-separated polymer blend.

13. A top gate thin film transistor:
    (a) a substrate;
    (b) a gate electrode;
    (c) a semiconductor layer; and
    (d) a gate dielectric comprising a lower-k dielectric polymer-majority/higher-k dielectric polymer-minority first phase and a higher-k dielectric polymer-majority/lower-k dielectric polymer-minority second phase, wherein the first phase is located in a region of the dielectric structure closest to the semiconductor layer.

14. The thin film transistor of claim 13, wherein the lower-k dielectric polymer is at a concentration ranging from about 40% to 0% and the higher-k dielectric polymer is at a concentration ranging from about 60% to 100% of the total weight of the lower-k and the higher-k dielectric polymers in the first phase.

15. The thin film transistor of claim 13, wherein the lower-k dielectric polymer is at a concentration ranging from about 40% to about 10% and the higher-k dielectric polymer is at a concentration ranging from about 60% to about 90% of the total weight of the lower-k and the higher-k dielectric polymers in the first phase.

16. The thin film transistor of claim 13, wherein the lower-k dielectric polymer has a dielectric constant of less than 4.0.

17. The thin film transistor of claim 13, wherein the higher-k dielectric polymer has a dielectric constant of 4.0 or more.

18. The thin film transistor of claim 13, wherein the lower-k dielectric polymer and the higher-k dielectric polymer are crosslinked.

19. The thin film transistor of claim 13, wherein the lower-k dielectric polymer is selected from the group consisting of polystyrene, poly(4-methylstyrene), poly(chlorostyrene), poly(α-methylstyrene), polysiloxane including poly(dimethyl siloxane) and poly(diphenyl siloxane), polysilsesquioxane, poly(methyl silsisquioxane), and poly(phenyl silsesquioxane), polyphenylene, poly(1,3-butadiene), poly(α-vinylnaphtalene), polypropylene, polyisoprene, polyisobutylene, polyethylene, poly(4-methyl-1-pentene), poly(p-xylene), poly(cyclohexyl methacrylate), poly (propylmethacrylPOSS-co-methylmethacrylate), poly(propylmethacrylPOSS-co-styrene), poly(styrylPOSS-co-styrene), poly(vinyl cinnamate), and mixtures thereof.

* * * * *